(12) United States Patent
Kim et al.

(10) Patent No.: US 11,249,570 B2
(45) Date of Patent: Feb. 15, 2022

(54) ELECTRONIC DEVICE COMPRISING SENSING PANEL

(71) Applicant: Samsung Electronics Co., Ltd., Suwon-si (KR)

(72) Inventors: Yong Woon Kim, Suwon-si (KR); Jang Hoon Lee, Suwon-si (KR)

(73) Assignee: Samsung Electronics Co., Ltd., Suwon-si (KR)

( * ) Notice: Subject to any disclaimer, the term of this patent is extended or adjusted under 35 U.S.C. 154(b) by 0 days.

(21) Appl. No.: 16/763,948

(22) PCT Filed: Nov. 7, 2018

(86) PCT No.: PCT/KR2018/013465
§ 371 (c)(1),
(2) Date: May 13, 2020

(87) PCT Pub. No.: WO2019/093756
PCT Pub. Date: May 16, 2019

(65) Prior Publication Data
US 2020/0363892 A1    Nov. 19, 2020

(30) Foreign Application Priority Data

Nov. 13, 2017    (KR) .................. 10-2017-0150723

(51) Int. Cl.
*G06F 3/041*    (2006.01)
*G06F 3/046*    (2006.01)
*H05K 1/18*    (2006.01)

(52) U.S. Cl.
CPC ............ *G06F 3/0412* (2013.01); *G06F 3/046* (2013.01); *H05K 1/189* (2013.01)

(58) Field of Classification Search
CPC .............................. G06F 3/0412; G06F 3/046
See application file for complete search history.

(56) References Cited

U.S. PATENT DOCUMENTS 9,410,824 B2    8/2016    Kobori
2011/0175834 A1    7/2011    Han et al.
(Continued)

FOREIGN PATENT DOCUMENTS

CN    203588244 U    5/2014
JP    2014-063249 A    4/2014
(Continued)

OTHER PUBLICATIONS

International Search Report dated Jan. 25, 2019 in connection with International Patent Application No. PCT/KR2018/013465, 2 pages.
(Continued)

*Primary Examiner* — Kevin M Nguyen

(57) ABSTRACT

An electronic device according to various embodiments may include an electromagnetic radiation (EMR) sensor panel and a sensor circuit configured to detect a stylus pen, using the EMR sensor panel, wherein the EMR sensor panel comprises a first layer, a second layer, and a third layer which are substantially parallel to the display panel, the first layer comprises a first plurality of conductive lines which extend parallel to one another in a first direction, the second layer comprises a second plurality of conductive lines which extend parallel to one another in a second direction substantially perpendicular to the first direction, and the third layer includes a third plurality of conductive lines, each of the third plurality of conductive lines electrically connected to ends of respective two of the first plurality of the conductive lines or the second plurality of the conductive lines, through conductive vias formed through at least one of the first layer, the second layer, or the third layer.

19 Claims, 13 Drawing Sheets

(56) References Cited

U.S. PATENT DOCUMENTS

| | | |
|---|---|---|
| 2011/0279405 A1 | 11/2011 | Meng |
| 2012/0280929 A1 | 11/2012 | Rimon et al. |
| 2014/0078101 A1 | 3/2014 | Katsurahira |
| 2017/0075444 A1* | 3/2017 | Nade .................... H04M 1/0268 |
| 2017/0153748 A1* | 6/2017 | Choi ..................... G06F 3/0446 |

FOREIGN PATENT DOCUMENTS

| | | |
|---|---|---|
| JP | 2016-029519 A | 3/2016 |
| KR | 10-2014-0041347 A | 4/2014 |
| KR | 10-2016-0000803 A | 1/2016 |

OTHER PUBLICATIONS

Written Opinion of the International Searching Authority dated Jan. 25, 2019 in connection with International Patent Application No. PCT/KR2018/013465, 5 pages.

\* cited by examiner

ELECTRONIC DEVICE COMPRISING SENSING PANEL

CROSS-REFERENCE TO RELATED APPLICATIONS

This application is a 371 of International Application No. PCT/KR2018/013465 filed on Nov. 7, 2018, which claims priority to Korean Patent Application No. 10-2017-0150723 filed on Nov. 13, 2017, the disclosures of which are herein incorporated by reference in their entirety.

FIELD

The present disclosure relates generally to an electronic device including a sensor panel.

DESCRIPTION OF RELATED ART

An electronic device may include various functions and execute multiple functions through a screen. For example, the electronic device may output and control contents, and sense a touch using a display which includes touch circuitry exposed through the screen (or an active area). The electronic device may include a bezel (or an inactive area) which surrounds the screen. The bezel is an area for mounting wirings, driving circuitry, a conductive connecting member, and so on, for sending input/output signals to the screen, and may be implemented not to be perceived by a user through an opaque printed layer. In recent, an area of the bezel of the electronic device is decreasing to enhance aesthetical pleasing.

The electronic device may further include an electromagnetic radiation (EMR) sensor panel which detects an indicated position using a stylus pen, in addition to a conventional touchscreen display. The EMR sensor panel may detect the indicated position using the EMR with a resonance circuit of the stylus pen. A conventional EMR sensor panel may not detect an accurate position on edges, due to limitations in a loop coil pattern design. Various embodiments of the present disclosure may provide an EMR sensor panel for accurately detecting a position throughout the active area.

SUMMARY

According to various embodiments of the present disclosure, an electronic device may include a housing including a front plate and a back plate which faces away from the front plate, a display panel interposed between the front plate and the back plate and exposed through the front plate, an electromagnetic radiation (EMR) sensor panel interposed between the display panel and the back plate, and a sensor circuit configured to detect a stylus pen, using the EMR sensor panel, wherein the EMR sensor panel includes a first layer, a second layer, and a third layer which are substantially parallel to the display panel, the first layer includes a first plurality of conductive lines which extend parallel to one another in a first direction, when viewed from above the front plate, the second layer includes a second plurality of conductive lines which extend parallel to one another in a second direction substantially perpendicular to the first direction, when viewed from above the front plate, and the third layer includes a third plurality of conductive lines, each of the third plurality of conductive lines electrically connected to ends of respective two of the first plurality of the conductive lines or the second plurality of the conductive lines, through conductive vias formed through at least one of the first layer, the second layer, or the third layer.

According to various embodiments of the present disclosure, an electronic device may include a housing including a front plate and a back plate which faces away from the front plate, a display panel interposed between the front plate and the back plate and exposed through an active area of the front plate, an EMR sensor panel interposed between the display panel and the back plate, and a sensor circuit configured to detect a stylus pen, using the EMR sensor panel, wherein the EMR sensor panel includes a first layer, a second layer, and a third layer which are substantially parallel to the display panel, wherein the first layer includes a first plurality of conductive lines which extend parallel to one another in a first direction, when viewed from above the front plate, the second layer includes a second plurality of conductive lines which extend parallel to one another in a second direction substantially perpendicular to the first direction, when viewed from above the front plate, the third layer includes a third plurality of conductive lines and a fourth plurality of conductive lines, each of the third plurality of the conductive lines is electrically connected to first ends of respective two of the first plurality of the conductive lines or the second plurality of the conductive lines, through first conductive vias formed through at least one of the first layer, the second layer, or the third layer, and each of the fourth plurality of the conductive lines is electrically connected to second ends of respective two of the first plurality of the conductive lines and the second plurality of the conductive lines, through second conductive vias formed through at least one of the first layer, the second layer, or the third layer, and is integrated to a connector of the third layer.

An electronic device including a sensing panel according to various embodiments of the present disclosure may accurately detect an indication position using a stylus pen even at an edge of an active area. In addition, various effects directly or indirectly identified through the present disclosure may be provided.

DETAILED DESCRIPTION

Figure 1:
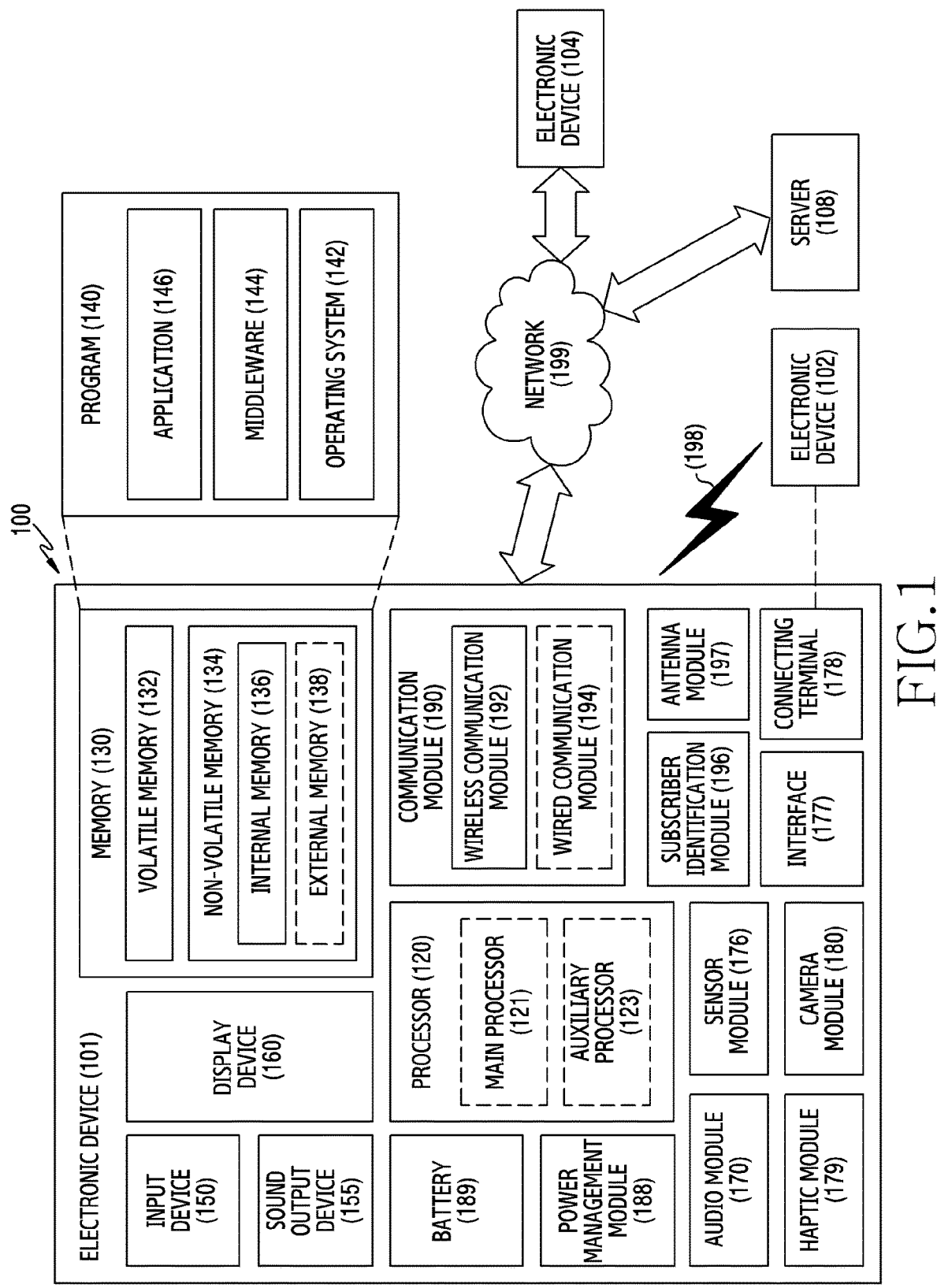
FIG. 1 is a block diagram of an electronic device in a network environment according to various embodiments.

Hereinafter, various embodiments of the present disclosure will be described with reference to the accompanying drawings. However, it should be understood that the present disclosure is not limited to the particular forms disclosed herein. Rather, the present disclosure should be understood to cover various modifications, equivalents, and/or alternatives of embodiments of the present disclosure. In describing the drawings, similar reference numerals may be used to designate similar constituent elements.

As used herein, the expressions "have", "may have", "include", or "may include" refer to the existence of a corresponding feature (e.g., numeral, function, operation, or constituent element such as component), and do not exclude one or more additional features.

In the present disclosure, the expressions "A or B", "at least one of A or/and B", or "one or more of A or/and B" may include all possible combinations of the items listed. For example, the expressions "A or B", "at least one of A and B", or "at least one of A or B" refer to all of (1) including at least one A, (2) including at least one B, or (3) including all of at least one A and at least one B.

The expressions "a first", "a second", "the first", or "the second" as used in various embodiments of the present disclosure may be used to denote various components regardless of the order and/or the importance but do not limit the corresponding components. Such terms may be used for distinguishing one element from another element. For example, a first user device and a second user device indicate different user devices although both of them are user devices. For example, a first element may be referred to as a second element, and similarly, a second element may be referred to as a first element, without departing from the scope of the present disclosure.

It should be understood that when an element (e.g., first element) is referred to as being (operatively or communicatively) "connected," or "coupled," to another element (e.g., second element), it may be directly connected or coupled directly to the other element or any other element (e.g., third element) may be interposed between them. On the other hand, when an element (e.g., first element) is referred to as being "directly connected," or "directly coupled" to another element (second element), there are no elements (e.g., third element) interposed between them.

The expression "configured (or set) to" as used in the present disclosure may be used interchangeably with, for example, "suitable for", "having the capacity to", "designed to", "adapted to", "made to", or "capable of" according to the situation. The term "configured (or set) to" may not necessarily imply "specifically designed to" in hardware. Alternatively, in some situations, the expression "device configured to" may refer to a situation in which the device, together with other devices or components, "is able to". The phrase "processor adapted (or configured) to perform A, B, and C" may refer, for example, and without limitation, to a dedicated processor (e.g. embedded processor) only for performing the corresponding operations or a general-purpose processor (e.g., central processing unit (CPU) or application processor (AP)) that may perform the corresponding operations by executing one or more software programs stored in a memory device.

The terms used in the present disclosure are only used to describe specific embodiments, and are not intended to limit the present disclosure. As used herein, singular forms may include plural forms as well unless the context clearly indicates otherwise. Unless defined otherwise, all terms used herein, including technical and scientific terms, have the same meaning as those commonly understood by a person skilled in the art to which the present disclosure pertains. Terms such as those defined in a generally used dictionary may be interpreted to have the meanings equal to the contextual meanings in the relevant field of art, and are not to be interpreted to have ideal or excessively formal meanings unless clearly defined in the present disclosure. In some cases, even where a term is defined in the present disclosure, it should not be interpreted to exclude embodiments of the present disclosure.

An electronic device according to various embodiments of the present disclosure may include at least one of, for example, a smart phone, a tablet Personal Computer (PC), a mobile phone, a video phone, an electronic book reader (e-book reader), a desktop PC, a laptop PC, a netbook computer, a workstation, a server, a Personal Digital Assistant (PDA), a Portable Multimedia Player (PMP), a MPEG-1 audio layer-3 (MP3) player, a mobile medical device, a camera, and a wearable device (e.g., smart glasses, a Head-Mounted-Device (HMD), an electronic textiles, an electronic bracelet, an electronic necklace, an appcessory, electronic tattoo, a smart mirror, or a smart watch).

According to an embodiment, the electronic device may be a smart home appliance. The smart home appliance may include at least one of, for example, a television, a Digital Video Disk (DVD) player, an audio player, a refrigerator, an air conditioner, a vacuum cleaner, an oven, a microwave oven, a washing machine, an air cleaner, a set-top box, a home automation control panel, a security control panel, a TV box (e.g., Samsung HomeSync™, Apple TV™, or Google TV™), a game console (e.g., Xbox™ and PlayStation™), an electronic dictionary, an electronic key, a camcorder, and an electronic photo frame.

According to other embodiment, the electronic device may include at least one of various medical devices (e.g., various portable medical measuring devices (a blood glucose monitoring device, a heart rate monitoring device, a blood pressure measuring device, a body temperature measuring device, etc.), a Magnetic Resonance Angiography (MRA), a Magnetic Resonance Imaging (MRI), a Computed Tomography (CT) machine, and an ultrasonic machine), a navigation device, a Global Positioning System (GPS) receiver, an Event Data Recorder (EDR), a Flight Data Recorder (FDR), a vehicle infotainment device, an electronic device for a ship (e.g., a navigation device for a ship, and a gyro-compass), avionics, security devices, an automotive head unit, a robot for home or industry, an Automatic Teller Machine (ATM), a Point Of Sales (POS) terminal, or an Internet of Things (IoT) device (e.g., a light bulb, various sensors, electric or gas meter, a sprinkler device, a fire alarm, a thermostat, a streetlamp, a toaster, a sporting good, a hot water tank, a heater, a boiler, etc.).

According to an embodiment, the electronic device may include at least one of a part of furniture or a building/structure, an electronic board, an electronic signature receiving device, a projector, and various kinds of measuring instruments (e.g., a water meter, an electric meter, a gas meter, and a radio wave meter). In various embodiments, the electronic device may be a combination of one or more of the aforementioned various devices. According to an embodiment, the electronic device may be a flexible device. Further, the electronic device is not limited to the aforementioned devices, and may include a new electronic device according to the development of new technology.

FIG. 1 is a block diagram illustrating an electronic device 101 in a network environment 100 according to various embodiments. Referring to FIG. 1, the electronic device 101 in the network environment 100 may communicate with an electronic device 102 via a first network 198 (e.g., a short-range wireless communication network), or an electronic device 104 or a server 108 via a second network 199 (e.g., a long-range wireless communication network). According to an embodiment, the electronic device 101 may communicate with the electronic device 104 via the server 108. According to an embodiment, the electronic device 101 may include a processor 120, memory 130, an input device 150, a sound output device 155, a display device 160, an audio module 170, a sensor module 176, an interface 177, a haptic module 179, a camera module 180, a power management module 188, a battery 189, a communication module 190, a subscriber identification module (SIM) 196, or an antenna module 197. In some embodiments, at least one (e.g., the display device 160 or the camera module 180) of the components may be omitted from the electronic device 101, or one or more other components may be added in the electronic device 101. In some embodiments, some of the components may be implemented as single integrated circuitry. For example, the sensor module 176 (e.g., a fingerprint sensor, an iris sensor, or an illuminance sensor) may be implemented as embedded in the display device 160 (e.g., a display).

The processor 120 may execute, for example, software (e.g., a program 140) to control at least one other component (e.g., a hardware or software component) of the electronic device 101 coupled with the processor 120, and may perform various data processing or computation. According to one embodiment, as at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. According to an embodiment, the processor 120 may include a main processor 121 (e.g., a central processing unit (CPU) or an application processor (AP)), and an auxiliary processor 123 (e.g., a graphics processing unit (GPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display device 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). According to an embodiment, the auxiliary processor 123 (e.g., an image signal processor or a communication processor) may be implemented as part of another component (e.g., the camera module 180 or the communication module 190) functionally related to the auxiliary processor 123. The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134.

The program 140 may be stored in the memory 130 as software, and may include, for example, an operating system (OS) 142, middleware 144, or an application 146.

The input device 150 may receive a command or data to be used by other component (e.g., the processor 120) of the electronic device 101, from the outside (e.g., a user) of the electronic device 101. The input device 150 may include, for example, a microphone, a mouse, or a keyboard.

The sound output device 155 may output sound signals to the outside of the electronic device 101. The sound output device 155 may include, for example, a speaker or a receiver. The speaker may be used for general purposes, such as playing multimedia or playing record, and the receiver may be used for an incoming calls. According to an embodiment, the receiver may be implemented as separate from, or as part of the speaker.

The display device 160 may visually provide information to the outside (e.g., a user) of the electronic device 101. The display device 160 may include, for example, a display, a hologram device, or a projector and control circuitry to control a corresponding one of the display, hologram device, and projector. According to an embodiment, the display device 160 may include touch circuitry adapted to detect a touch, or sensor circuitry (e.g., a pressure sensor) adapted to measure the intensity of force incurred by the touch.

The audio module 170 may convert a sound into an electrical signal and vice versa. According to an embodiment, the audio module 170 may obtain the sound via the input device 150, or output the sound via the sound output device 155 or a headphone of an external electronic device (e.g., an electronic device 102) directly (e.g., wired) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. According to an embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wired) or wirelessly. According to an embodiment, the interface 177 may include, for example, a high definition multimedia interface (HDMI), a universal serial bus (USB) interface, a secure digital (SD) card interface, or an audio interface.

A connecting terminal 178 may include a connector via which the electronic device 101 may be physically connected with the external electronic device (e.g., the electronic device 102). According to an embodiment, the connecting terminal 178 may include, for example, a HDMI connector, a USB connector, a SD card connector, or an audio connector (e.g., a headphone connector), The haptic module 179 may convert an electrical signal into a mechanical stimulus (e.g., a vibration or a movement) or electrical stimulus which may be recognized by a user via his tactile sensation or kinesthetic sensation. According to an embodiment, the haptic module 179 may include, for example, a motor, a piezoelectric element, or an electric stimulator.

The camera module 180 may capture a still image or moving images. According to an embodiment, the camera module 180 may include one or more lenses, image sensors, image signal processors, or flashes.

The power management module 188 may manage power supplied to the electronic device 101. According to one embodiment, the power management module 188 may be implemented as at least part of, for example, a power management integrated circuit (PMIC).

The battery 189 may supply power to at least one component of the electronic device 101. According to an embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently from the processor 120 (e.g., the application processor (AP)) and supports a direct (e.g., wired) communication or a wireless communication. According to an embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or infrared data association (IrDA)) or the second network 199 (e.g., a long-range communication network, such as a cellular network, the Internet, or a computer network (e.g., LAN or wide area network (WAN)). These various types of communication modules may be implemented as a single component (e.g., a single chip), or may be implemented as multi components (e.g., multi chips) separate from each other.

The wireless communication module 192 may identify and authenticate the electronic device 101 in a communication network, such as the first network 198 or the second network 199, using subscriber information (e.g., international mobile subscriber identity (IMSI)) stored in the subscriber identification module 196.

The antenna module 197 may transmit or receive a signal or power to or from the outside (e.g., the external electronic device) of the electronic device 101. According to an embodiment, the antenna module 197 may include one or more antennas, and, therefrom, at least one antenna appropriate for a communication scheme used in the communication network, such as the first network 198 or the second network 199, may be selected, for example, by the communication module 190 (e.g., the wireless communication module 192). The signal or the power may then be transmitted or received between the communication module 190 and the external electronic device via the selected at least one antenna.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an embodiment, commands or data may be transmitted or received between the electronic device 101 and the external electronic device 104 via the server 108 coupled with the second network 199. Each of the electronic devices 102 and 104 may be a device of a same type as, or a different type, from the electronic device 101. According to an embodiment, all or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, or client-server computing technology may be used, for example.

The electronic device according to various embodiments may be one of various types of electronic devices. The electronic devices may include, for example, a portable communication device (e.g., a smart phone), a computer device, a portable multimedia device, a portable medical device, a camera, a wearable device, or a home appliance. According to an embodiment of the disclosure, the electronic devices are not limited to those described above.

As used herein, the term "module" may include a unit implemented in hardware, software, or firmware, and may interchangeably be used with other terms, for example, "logic," "logic block," "part," or "circuitry". A module may be a single integral component, or a minimum unit or part thereof, adapted to perform one or more functions. For example, according to an embodiment, the module may be implemented in a form of an application-specific integrated circuit (ASIC).

Various embodiments as set forth herein may be implemented as software (e.g., the program 140) including one or more instructions that are stored in a storage medium (e.g., internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the term "non-transitory" simply means that the storage medium is a tangible device, and does not include a signal (e.g., an electromagnetic wave), but this term does not differentiate between where data is semi-permanently stored in the storage medium and where the data is temporarily stored in the storage medium.

According to an embodiment, a method according to various embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAYSTORE), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

According to various embodiments, each component (e.g., a module or a program) of the above-described components may include a single entity or multiple entities. According to various embodiments, one or more of the above-described components may be omitted, or one or more other components may be added. Alternatively or additionally, a plurality of components (e.g., modules or programs) may be integrated into a single component. In such a case, according to various embodiments, the integrated component may still perform one or more functions of each of the plurality of components in the same or similar manner as they are performed by a corresponding one of the plurality of components before the integration. According to various embodiments, operations performed by the module, the program, or another component may be carried out sequentially, in parallel, repeatedly, or heuristically, or one or more of the operations may be executed in a different order or omitted, or one or more other operations may be added.

Figure 2:
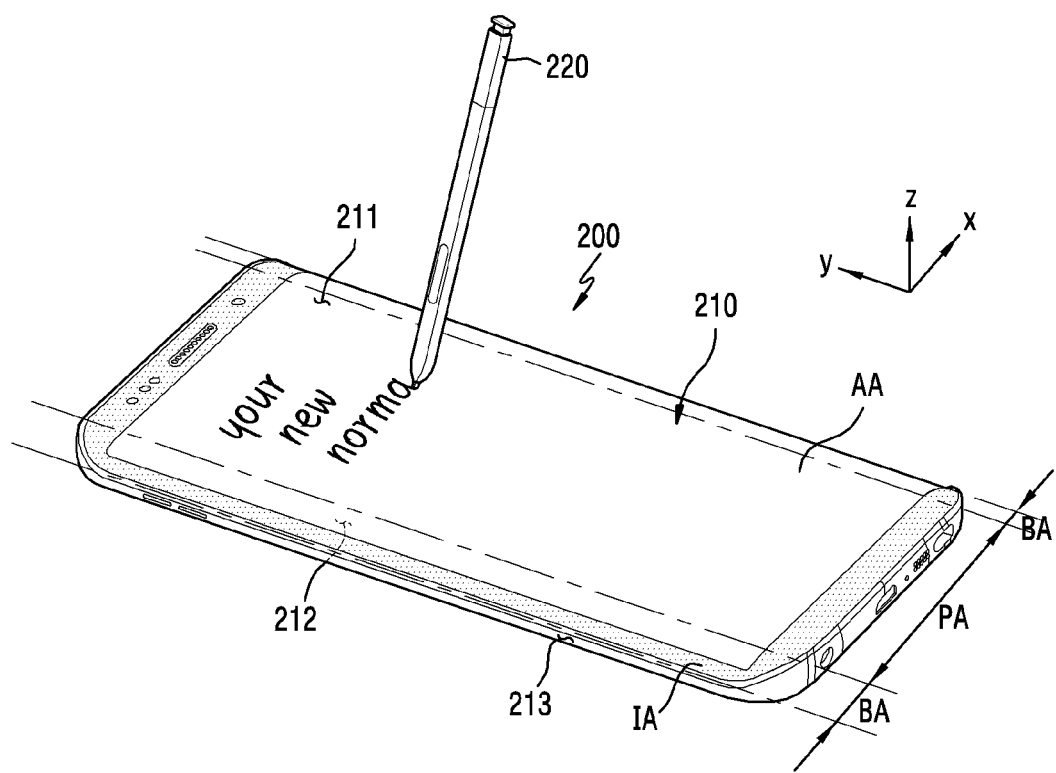
FIG. 2 is a perspective view of an electronic device according to various embodiments of the present disclosure.

FIG. 2 is a perspective view of an electronic device according to various embodiments of the present disclosure. Referring to FIG. 2, an electronic device 200 may have at least in part the same or similar configuration to the electronic device 100 of FIG. 1, and may detect an input using a position indicator 220 (or a stylus pen).

According to an embodiment, the electronic device 200 may include a housing 210 which forms its exterior. The housing 210 may be divided into a front surface, a side surface, and a back surface, for ease the understanding. For example, the housing 210 may include a front plate 211 (or a first plate) which faces a first direction (+z direction), a back plate 212 (or a second plate) which faces a second direction (the back surface, −z direction) opposite to the first direction, and a side plate 213 (or a third plate) which faces a third direction (÷x or ÷y direction) perpendicular or substantially perpendicular to the first direction (or the second direction). The side plate 213 may surround a space between the front plate 211 and the back plate 212.

According to an embodiment, the plates may form, independently or in at least in part conjunction, the front surface, the side surface, and the back surface respectively. Based on one side surface of the electronic device 200, at least part of the front plate 211 may be curved in shape and form the side surface of the electronic device 200 together with the side plate 213. For example, the front plate 211 may include a plan area (PA) and a bent area (BA) which is disposed symmetrically on either side of the PA. For example, the BA may be formed only in one side of the PA. The plates of the housing 210 each may have an arbitrarily suitable shape for a design in consideration of exterior and/or function, and may be integrally formed or individually assembled. Hence, it is not interpreted that the front plate 211, the back plate 212, and the back plate 213 each are not limited to a single component, and may have an arbitrarily adequate configuration.

According to an embodiment, the front plate 211 may be divided into an active area (AA) and an inactive area (IA) which is shaded. The AA may be transparent to transmit light or signals from various panels disposed therein, for example, the display panel or the sensor panel, or to interwork with a user or the position indicator 220. The electronic device 200 may provide the user with various user experiences such as writing or drawing on the AA using the position locator 220. The IA includes wirings, driving circuitry, a conductive connecting member, and so on, for transferring input/output signals to drive various panels, and may include an opaque printed layer not to be perceived by the user.

Figure 3:
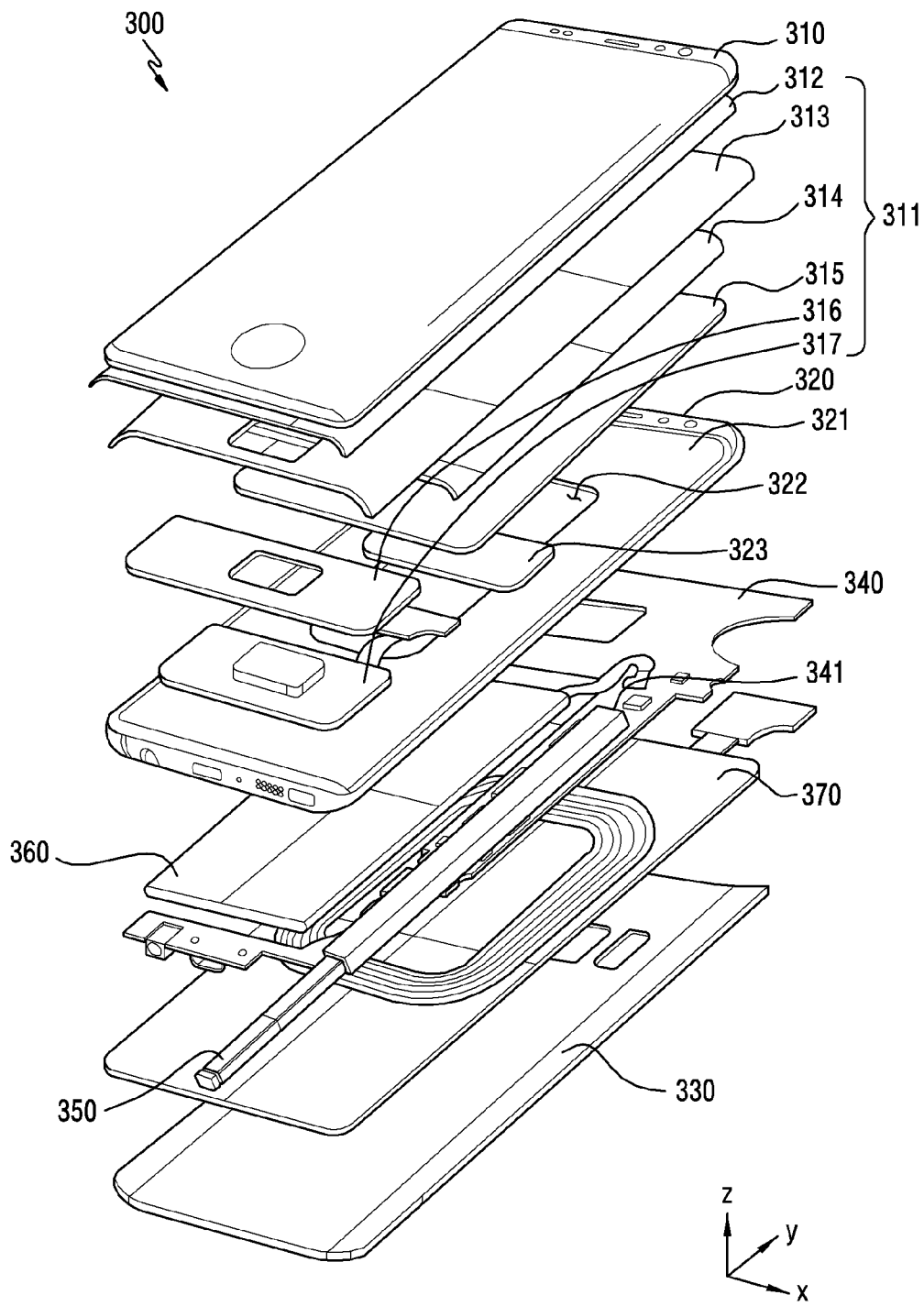
FIG. 3 is an exploded view of an electronic device including a bending display according to various embodiments of the present disclosure.

FIG. 3 is an exploded view of an electronic device including a bending display according to various embodiments of the present disclosure. Referring to FIG. 3, an electronic device 300 may include a front plate 310 (or a transparent cover), a side plate 320, a back plate 330, a printed circuit board 340, a position indicator 350 (or a stylus pen), a battery 360, and an antenna 370. At least one of the components of the electronic device 300 may be the same as or similar to at least one of the components of the electronic device 101 or 200 of FIG. 1 or FIG. 2, and their detailed descriptions shall be omitted.

According to an embodiment, the electronic device 300 may include a plurality of panels 311 interposed between the front plate 310 and the back plate 330. According to an embodiment, the panels 311 may include a display panel 312, a sensor panel 313, a conductive shield panel 341, a dielectric layer 315, a pressure sensor panel 316, and/or a fingerprint sensor panel 317. The panels 311 may be laminated (or adhered) in order below the front plate 310. When viewed from above the front plate 310, at least some of the front plate 310 and the panels 311, for example, the display panel 312 and the sensor panel 313 may be laminated to overlap most of their area. Hereafter, "viewed from above" may indicate that the display panel 312 or the sensor panel 313 disposed downwards (−z direction) below the front plate 310 is viewed from above. In some embodiments, the panels 313 may be overlapped only in part of the front plate 310, in order to reduce a thickness of the electronic device 300. For example, at least part of the pressure sensor panel 316 may be substantially flush with the conductive shield panel 314. According to some embodiments, at least part of the fingerprint sensor panel 317 may be substantially flush with the dielectric layer 315.

According to an embodiment, the side plate 320 may include a support 321 which is integrally formed therein or configured with a separate member. The support 321 may be coupled with the front plate 310 in one surface and coupled with the printed circuit board 340 in the other surface.

According to an embodiment, a processor, a memory, and/or an interface may be mounted (or disposed) on the printed circuit board 340. The processor may include, for example, one or more of a central processing unit, an application processor, a graphics processing unit, an image signal processor, a sensor hub processor, or a communication processor. The memory may include, for example, a volatile memory or a nonvolatile memory. The interface may include, for example, a high definition multimedia interface (HDMI), a universal serial bus (USB) interface, a secure digital (SD) card interface, and/or an audio interface. The interface may, for example, electrically or physically interconnect the electronic device 300 with an external electronic device, and may include a USB connector, an SD card connector/multi-media card (MMC) connector, or an audio connector.

According to an embodiment, the position indicator 350 may function as an input device for the front plate 310. The position indicator 350 may be mounted to be detachable from a receiving space in the electronic device 300. For example, the printed circuit board 340 may include a receiver 341 for the position indicator 350. An insert hole 324 through which the position indicator 350 may pass may be formed in one side of the side plate 320. The receiver 341 according to some embodiments may further include a sensor for identifying whether the position indicator 350 is detached.

According to an embodiment, the battery 360 may supply power to at least one component of the electronic device 300 and may include, for example, a primary cell which is not rechargeable, a secondary cell which is rechargeable, or a fuel cell. At least part of the battery 360 may be substantially flush with, for example, the printed circuit board 340. The battery 360 may be integrally disposed in the electronic device 300 or detachably disposed in the electronic device 300. According to an embodiment, the electronic device 300 may include an opening (or a housing slot 322) which is formed in at least part of the support 321. The opening 322 may be used as a space to compensate for swelling of the battery 360.

According to an embodiment, the antenna 370 may be disposed between the back plate 330 and the battery 360. The antenna 370 may include, for example, a near field communication (NFC) antenna, a wireless chargeable antenna, and/or a magnetic secure transmission (MST) antenna. The antenna 370 may, for example, perform short-range communication with an external device or wirelessly transmit and receive the power for charging. According to another embodiment, an antenna radiator may be further included in part of the side plate 320 and/or the support 321, to thus form an antenna structure together with the antenna 370. According to an embodiment, a conductor 323 may cover at least part of the opening 322 of the support 321. The conductor 323 may be configured to prevent antenna performance degradation, by shifting a parasitic resonance frequency of the opening 323 into the outband.

Figure 4:
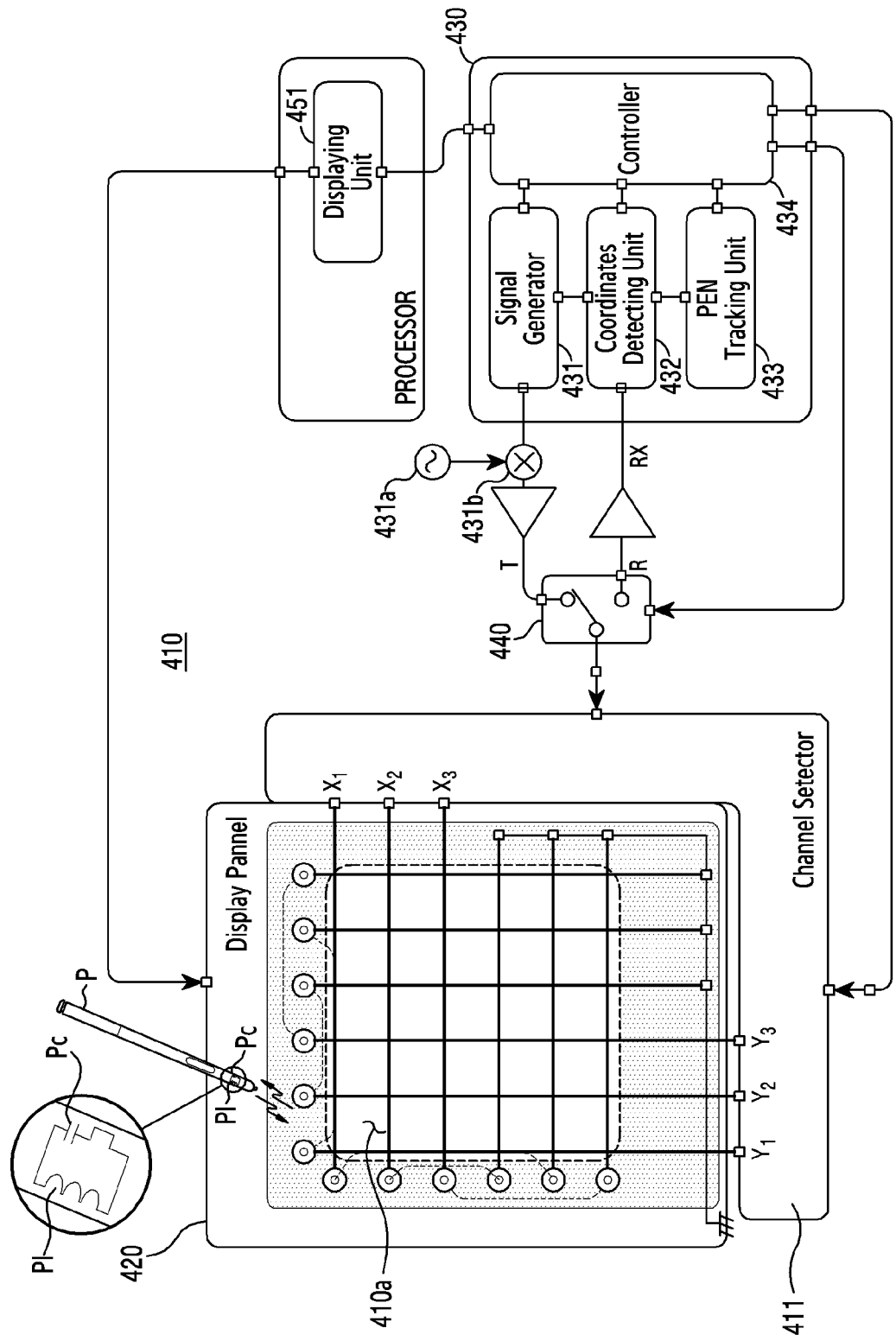
FIG. 4 a diagram of a device for controlling a sensor panel according to various embodiments of the present disclosure.

FIG. 4 a diagram of a device for controlling a sensor panel according to various embodiments of the present disclosure. Referring to FIG. 4, operations for detecting an indicated position of a position indicator P for a sensor panel 410 of an electronic device (e.g., the electronic device 300 of FIG. 3) are now explained.

According to an embodiment, an electronic device 400 may include the sensor panel 410, a display panel 420 disposed to substantially overlap a display area with a sensor area 410a of the sensor panel 410, and a sensor circuit 430. The sensor panel 410 may be connected to the sensor circuit 430 mounted on a printed circuit board (e.g., the printed circuit board 340 of FIG. 3) through a connector (not shown).

According to an embodiment, the sensor circuit 430 may include a signal generator 431, a coordinates detecting unit 432, a pen tracking unit 433, and a controller 434 for controlling them.

According to an embodiment, the sensor panel 410 may include a first loop coil group $X_n$ and a second loop coil group $Y_n$. The first loop coil group $X_n$ and the second loop coil group $Y_n$ may be connected to a channel selector 411. The channel selector 411 may sequentially select a loop coil for transmitting and receiving signals, among the first loop coil group $X_n$ and the second loop coil group $Y_n$ of the sensor panel 410, according to a selection control signal from the controller 434. The loop coil selected at the channel selector 411 may be connected to a switching circuit 440.

According to an embodiment, the signal generator 431 is a circuit for providing a signal to the loop coil, and may be connected to an oscillator 431a and a current driver 431b. The oscillator 431a may generate an alternating current signal. The alternating current signal may be supplied to the current driver 431b, converted to the current, and then fed to the switching circuit 440. The switching circuit 440 may switch a terminal (a transmit terminal T or a receive terminal R) connected with the selected loop coil, at specific time intervals, under control of the controller 434. The transmit terminal T may be connected to the current driver 431b, and the receive terminal R may be connected to the coordinates detecting unit 432.

According to an embodiment, if the switching circuit 440 selects the transmit terminal T (in transmission), the alternating current signal may be supplied from the current driver 431b to the coil selected by the channel selector 411. If the switching circuit 440 selects the receive terminal R (in reception), a signal according to an induced voltage generated at the loop coil selected by the channel selector 411 may be provided to the coordinates detecting unit 432.

According to an embodiment, the coordinates detecting unit 432 may receive the signal according to the induced voltage generated at the loop coil selected by the channel selector 411. The signal may be supplied to the controller 434, through at least one of amplification, demodulation, sampling/hold, and analog to digital (A/D) conversion in the coordinates detecting unit 432.

According to an embodiment, the position indicator P may include a resonance circuit including an inductor PI and a capacitor Pc which is connected parallel to the inductor PI. The position indicator P which approaches the sensor panel 410 to a specific distance for the sake of the position input may receive a signal from the selected loop coil, charge the capacitor Pc with the signal, generate the induced voltage using the inductor PI, and thus transmit a return signal.

The controller 434 may control the switching circuit 440 to connect the receive terminal R. In this case, each of the first loop coil group $X_n$ and the second loop coil group $Y_n$ may generate the induced voltage according to the return signal transmitted from the position indicator P. The return signal transmitted from the position indicator P may be detected by the sensor circuit 430. Based on a level of the induced voltage generated at each loop coil, the coordinates detecting unit 432 may calculate coordinates of the indicated position of the X axis direction and/or the Y axis direction on an input surface of the sensor panel 410 (or the display 420).

According to an embodiment, the controller 434 may control to detect the indicated position of the position indicator P and concurrently process to specify the indicated position of the position indicator P on the sensor area 410a. Herein, controlling to detect the indicated position of the position indicator P may include selecting the loop coil for the channel selector 411, controlling the switching circuit 440 to switch a signal, processing a sampling/holding timing for the coordinates detecting unit 432 and/or the pen tracking unit 433, and so on. For example, the controller 434 may determine a scanning interval and a scanning channel of the channel selector 411 in response to the received signal of the position indicator P.

Now, the signal transmission and reception with the position indicator P according to an embodiment are described. In the sensor panel 410, the controller 434 may control the switching circuit 440 to connect the channel selector 411 to the transmit terminal T, select the loop coil for transmitting a signal among the loop coil groups $X_n$ and $Y_n$ using the above-mentioned method, and provide the alternating current signal from the signal generator 431 to the loop coil. The loop coil receiving the alternating current coil may transmit a signal to the position indicator P according to electromagnetic induction. The resonance circuit of the position indicator P may receive a signal from the loop coil, charge the capacitor Pc, generate the induced voltage at the coil PI, and transmit the return signal. The controller 434 may control the switching circuit 440 to connect to the receive terminal R. In this case, each of the coil loop groups $X_n$ and $Y_n$ may generate the induced voltage according to the return signal received from the position indicator P. The return signal received from the position indicator P may be detected by the coordinates detecting unit 432.

In other words, based on a level of the signal, which is the voltage, received at each loop coil, the controller 434 may calculate the coordinates of the indicated position of the X axis direction and the Y axis direction on the sensor area 410a of the sensor panel 410. Hence, the controller 434 may provide information of the calculated coordinates to a displaying unit 451 of a main processor 450. The displaying unit 451 may control to display an object designated based on the received indicated position, on the display 420. An area on the display 420, which corresponds to the sensor area 410a, may be defined as an AA. In this disclosure, the signal transmitted from the position indicator P and received at the sensor panel 410 may be referred to as the return signal or the received signal as stated above. By repeatedly transmitting the signal to the position indicator P and receiving the return signal from the position indicator P, the sensor panel 410 may specify the indicated position of the position indicator P on the sensor area 410a. The sensor panel 410 which includes the loop coil groups $X_n$ and $Y_n$ and detects the indicated position using the EMR of the position indicator P may be referred to as an EMR sensor panel.

Figure 5:
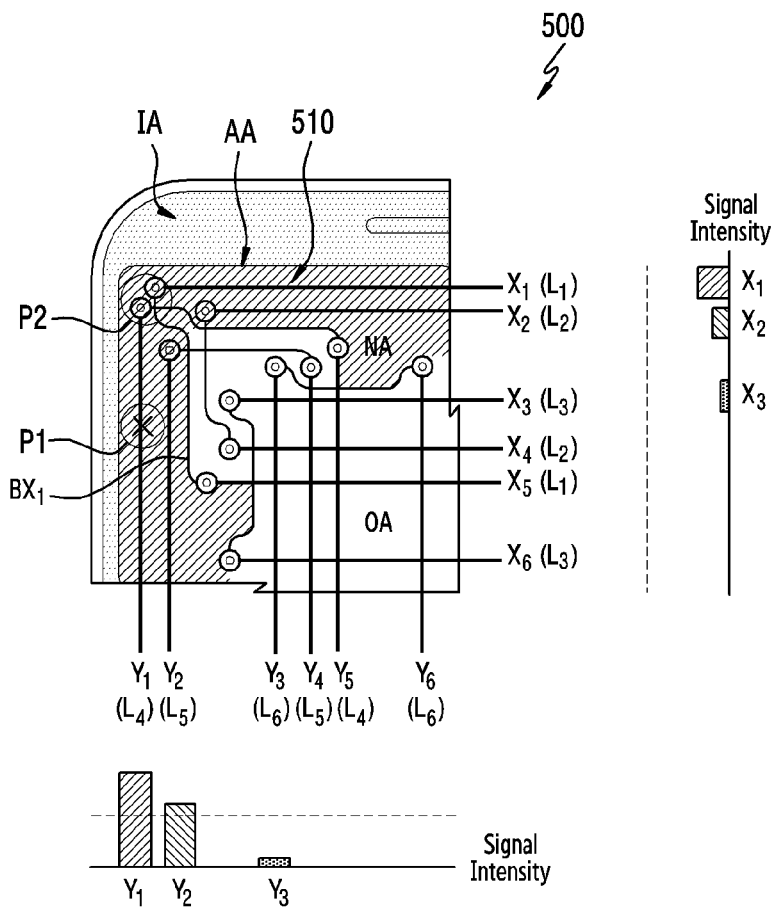
FIG. 5 is a diagram of an electronic device including a conventional sensor panel and its operations.

FIG. 5 is a diagram of an electronic device including a conventional sensor panel and its operations. Referring to FIG. 5, operations for detecting an indicated position on a conventional sensor panel 510 are explained.

In the electronic device including the conventional sensor panel 510 of FIG. 5, the sensor panel 510 is exposed through an AA (or the AA of FIG. 2) of the electronic device 500. The conventional sensor panel 510 of the electronic device 500 may include first conductive lines $X_n$ which are parallel to a first direction (e.g., a horizontal direction), second conductive lines $Y_n$ which are parallel to a second direction (e.g., a vertical direction) substantially perpendicular to the first direction, and bridge lines which forms a loop coil by electrically connecting respective two of the first conductive lines $X_n$ and the second conductive lines $Y_n$. For example, the first conductive line $X_1$ and the first conductive line $X_5$ may form the loop coil $L_1$ using the bridge line $BX_1$. Via holes for connecting the bridge lines and the conductive lines to form the loop coils may not be overlapped in order to prevent or minimize interference between the loop coils formed by the conductive lines and the bridge lines. Based on such limitations on the design, intervals between the conductive lines of the conventional sensor panel may not be uniform. For example, to prevent interference between the conductive lines and the via holes, the interval between the first conductive lines $X_2$ and $X_3$ is greater than the interval between $X_1$ and $X_2$. Hence, the sensor panel 510 may be divided into an overlap area (OA) of the first conductive lines $X_n$ and the second conductive lines $Y_n$, and a non-overlap area (NA). The OA may be defined as an area where the first conductive lines $X_n$ and the second conductive lines $Y_n$ cross to one another, and the NA may be defined as an area where the first conductive lines $X_n$ and the second conductive lines $Y_n$ are independent.

A front plate of the electronic device 500 may be divided into an AA and an IA. In aesthetic terms, as the IA reduces, at least part of the NA of the sensor panel 510 may be included in the AA. Thus, an input may be detected at other position than a user's intended position in the AA. For example, in response to a user input at a first position P1 in the NA using the position indicator P, the electronic device 500 may recognize a second position P2, rather than the first position P1. In case of the position detection of the second conductive lines $Y_n$, if the position indicator P transmits a return signal at the first position P1, the greatest received signal level (voltage) may be measured at the loop coil $L_4$. As getting apart from the loop coil $L_4$, the received signal level measured at the loop coil may decrease. Hence, the electronic device 500 may detect that the user's indicated position is at the second conductive line $Y_1$. In case of the position detection of the first conductive lines $X_n$, if the position indicator P transmits a return signal at the first position P1, the greatest received signal level (voltage) may be measured at the loop coil $L_1$. This is because the bridge line $BX_1$ of the loop coil $LX_1$ is the closest to the first position P1. Hence, the electronic device 500 may detect that the user's indicated position is at the first conductive line $X_1$, rather than the first conductive line $X_3$. Eventually, although the user desires the first position P1 as the indicated position, the electronic device 500 may detect the second position P2 as the indicated position. In conclusion, if the NA of the first conductive lines $X_n$ and the second conductive lines $Y_n$ of the sensor panel 510 is in the edge area of the AA, the user's indicated position for the edge area may be detected inaccurately. If the conventional sensor panel 510 detects the inaccurate indicated position, an additional process such as signal compensation may be needed. Since the inaccurate indicated position detection is irregular, the additional process may require considerable resources and time. In the following, a structure of a sensor panel for overcoming the disadvantages of the conventional sensor panel 510 is provided.

Figure 6A:
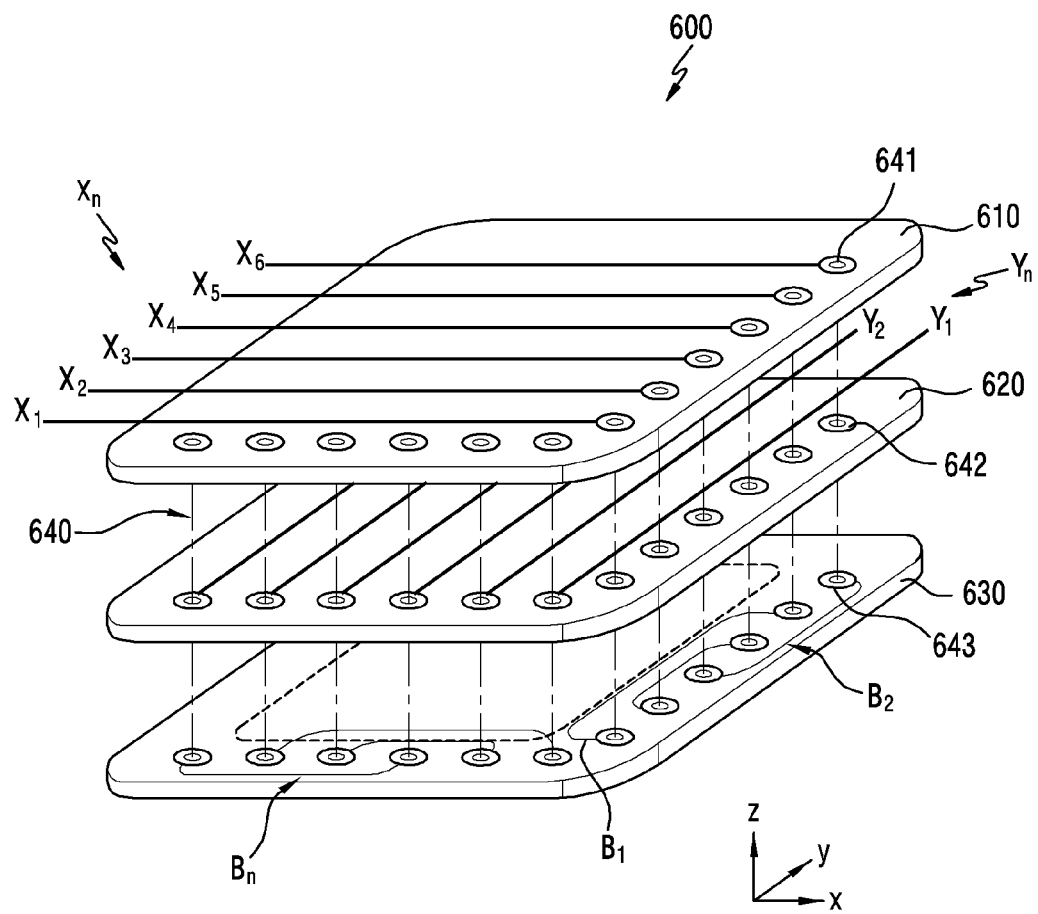
FIG. 6A is a perspective view of a lamination structure of a sensor panel according to various embodiments of the present disclosure.

FIG. 6A is a perspective view of a lamination structure of a sensor panel according to various embodiments of the present disclosure. According to various embodiments of the present disclosure, a sensor panel 600 may include a first layer 610 including first conductive lines $X_n$, a second layer 620 including second conductive lines $Y_n$, and a third layer 630 including bridge lines $B_n$. The sensor panel 600 may be configured by adding the third 630 to a conventional sensor panel (e.g., the conventional sensor panel 510 of FIG. 5).

According to an embodiment, the first layer 610 may include the plurality of the first conductive lines $X_n$ which extend parallel to a first direction (e.g., the x axis direction or the horizontal direction). The second layer 620 may include the plurality of the second conductive lines $Y_n$ which extend parallel to a second direction (e.g., the y axis direction or the vertical direction) substantially perpendicular to the first direction. The first conductive lines $X_n$ and the second conductive lines $Y_n$ may be conductive patterns which are formed on the first layer 610 and the second layer 620 respectively, as printed circuit boards. The third layer 630 may include the bridge lines $B_n$. The bridge lines $B_n$ may form a loop coil $L_n$ by electrically connecting respective two of the first conductive lines $X_n$ or the second conductive lines $Y_n$. The first conductive lines $X_n$, the second conductive lines $Y_n$, and the bridge lines $B_n$ formed on the respective layer may be electrically connected by a conductive via 640. For example, conductive via holes 641, 642, and 643 formed at corresponding positions of the layers may electrically connect the first conductive line $X_6$ of the first layer 610 and the bridge line $B_2$ of the third layer 630.

According to an embodiment, the conductive vias 640 may be disposed at edges of the sensor panel 600. Since the bridge lines $B_n$ are formed on the third layer 630 separately from the first layer 610 and the second layer 620, the bridge lines $B_n$ may overlap the first conductive lines $X_n$ and the second conductive lines $Y_n$, when viewed from above. The first conductive lines $X_n$ and the second conductive lines $Y_n$ may be formed on the first layer 610 or the second layer 620 without considering the positions of the bridge lines $B_n$. Accordingly, the first and second conductive lines $X_n$ and $Y_n$ may be formed at regular intervals. Overlapping areas (e.g., the OA of FIG. 5) of the first conductive lines $X_n$ and the second conductive lines $Y_n$ may be maximized. Alternatively, little NA (e.g., the NA of FIG. 5) where the first conductive lines $X_n$ and the second conductive lines $Y_n$ are not overlapped may be substantially formed. In other words, the sensing area of the sensor panel 600 may be maximized.

Figure 6B:
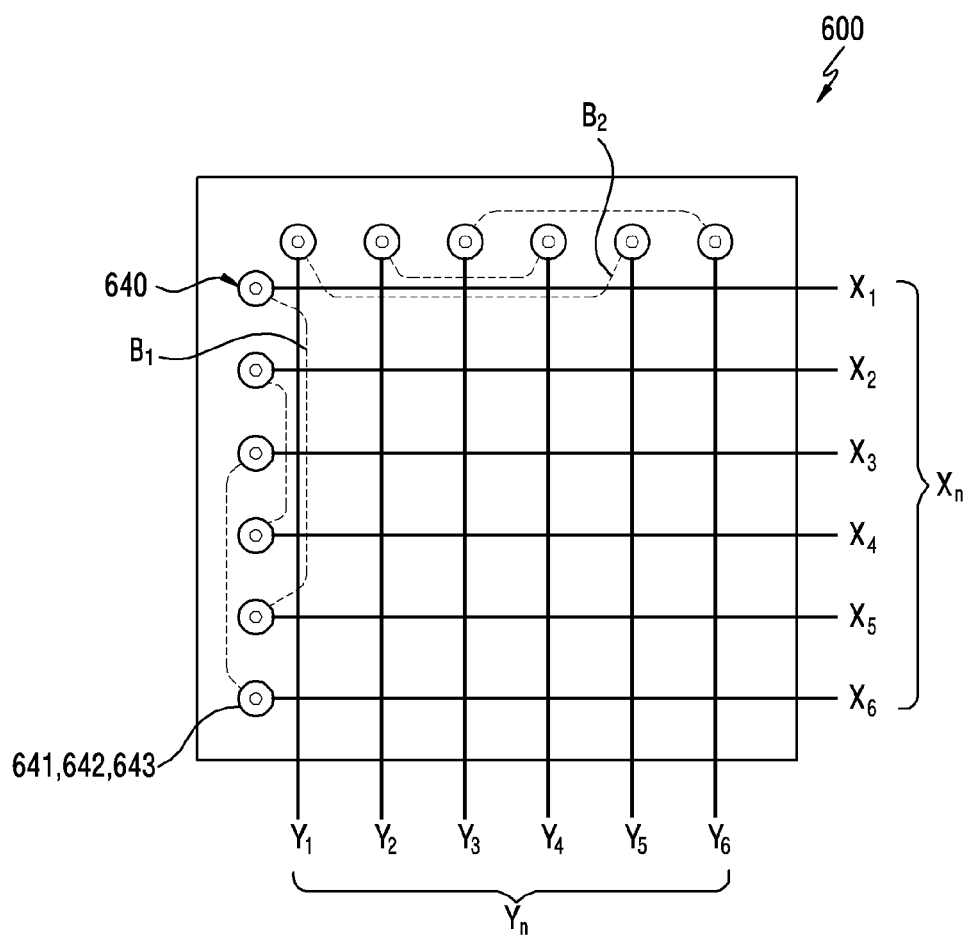
FIG. 6B is a plan view taken from above a sensor panel according to various embodiments of the present disclosure.

FIG. 6B is a plan view taken from above the sensor panel of FIG. 6A. Referring to FIG. 6B, the conductive vias 640, the via holes 641, 642, and 643, and the bridge lines $B_n$ according to various embodiments of the present disclosure may be arranged on the edges of the sensor panel 600. For example, the via holes 641, 642, and 643 which electrically connect the first conductive line $X_6$ may be disposed outside the second conductive line $Y_1$ which is disposed outermost in the second direction (the y axis direction). For example, the bridge line $B_2$ which electrically connects the first conductive line $X_3$ and the first conductive line $X_6$ may be disposed outside the outermost second conductive line $Y_1$. According to some embodiments, on the layout design of the bridge lines $B_n$, the bridge lines $B_n$ may overlap at least in part the conductive lines $X_n$ and $Y_n$. For example, the bridge line $B_1$ which electrically connects the first conductive line $X_1$ and the first conductive line $X_5$ may include a portion partially overlapping the second conductive line $Y_1$. That is, the bridge lines $B_n$ may be disposed substantially outside the outermost lines of the conductive lines $X_n$ and $Y_n$ of the sensor panel 600. Thus, by removing or minimizing the conductive lines $X_n$ and $Y_n$ which overlap the bridge lines $B_n$ in the sensor panel 600, the sensor area of the sensor panel 600 may be maximized and an error in detecting the indicated position in the overlapping area may be prevented.

Figure 7:
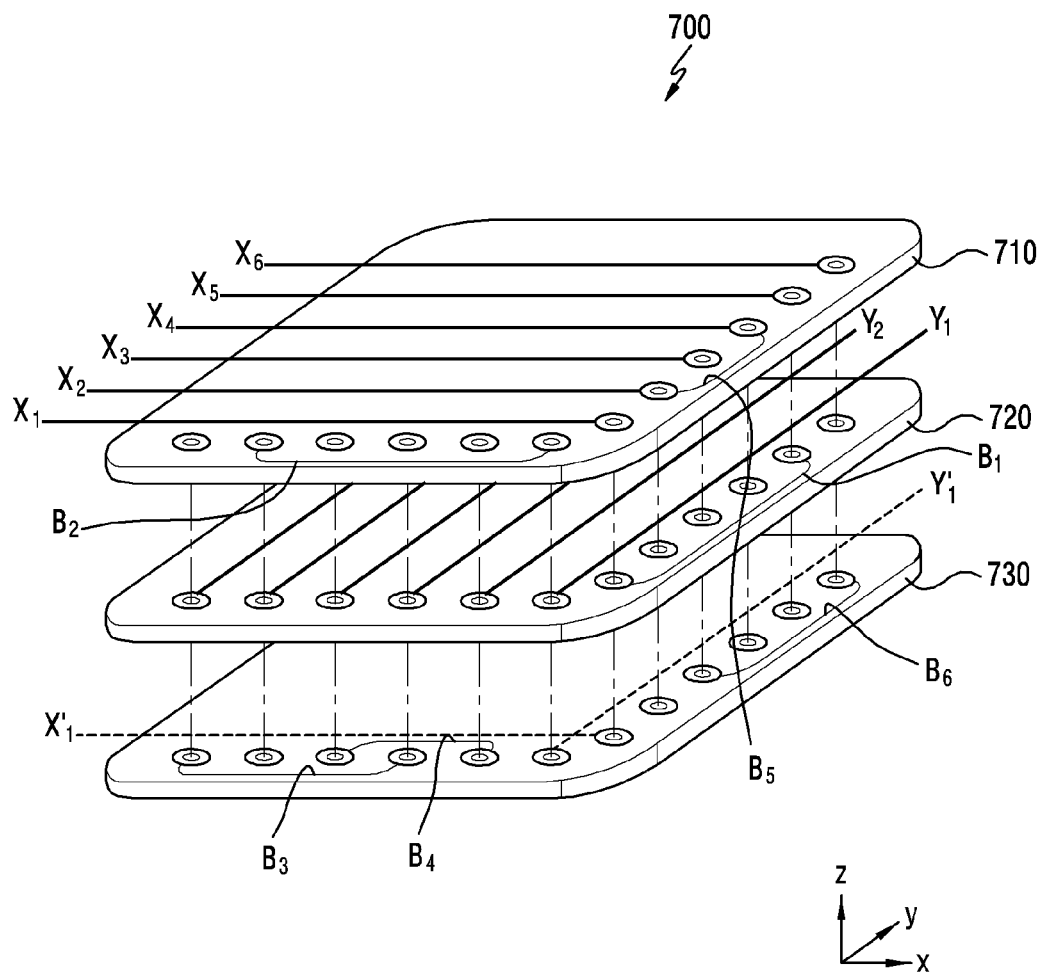
FIG. 7 is a perspective view of a lamination structure of a sensor panel according to various embodiments of the present disclosure.

FIG. 7 is a perspective view of a lamination structure of a sensor panel according to various embodiments of the present disclosure. A sensor panel 700 of FIG. 7 may be at least in part similar to the sensor panel 600 of FIG. 6A, which shall not be explained.

According to an embodiment, the sensor panel 700 may include a first layer 710, a second layer 720, and a third layer 730. The third layer 730 may include one or more bridge lines $B_n$ which form a loop coil by electrically connecting respective two of first conductive lines $X_n$ and second conductive lines $Y_n$. The bridge lines $B_n$, when viewed from above, may be formed outside outermost conductive lines of the first conductive lines $X_n$ and the second conductive lines $Y_n$. For example, the bridges lines $B_3$ and $B_4$ may be formed outside a line $X'_1$ corresponding to the first conductive line $X_1$ on the third layer 730. For example, the bridges lines $B_5$ and $B_6$ may be formed outside a line $Y'_1$ corresponding to the second conductive line $Y_1$.

According to an embodiment, bridge lines may be formed on the first layer 710 including the first conductive lines $X_n$ and the second layer 720 including the second conductive lines $Y_n$. For example, the first layer 710 may include the bridge line $B_2$ which is connected to conductive vias (or via holes) corresponding to the second conductive line $Y_1$ and the second conductive line $Y_5$. The bridge line $B_2$ may include a portion which is substantially parallel to the first conductive lines $X_n$. For example, the second layer 720 may include the bridge line $B_1$ which is connected to conductive vias (or via holes) corresponding to the conductive line $X_1$ and the conductive line $X_5$.

The bridge line $B_1$ may include a portion which is substantially parallel to the second conductive lines $Y_n$. The present disclosure is not limited to this embodiment, and the conductive lines and the bridge lines may form a loop coil on the same layer. For example, the first conductive line $X_2$ and the first conductive line $X_4$ on the first player 710 may be electrically connected by the bridge line $B_5$ to form a loop coil. In an embodiment, conductive via holes corresponding to the first conductive line $X_2$ and the first conductive line $X_4$ may not be formed.

According to an embodiment, the bridge lines formed on the first layer 710 and the second layer 720 may be, when viewed from above, formed outside the outermost conductive lines of the first conductive lines $X_n$ and the second conductive lines $Y_n$. That is, the bridge lines may be, when viewed from above, formed not to overlap or cross the first conductive lines $X_n$ and the second conductive lines $Y_n$. Alternatively, minimum bridge lines may overlap or cross the conductive lines $X_n$ and $Y_n$. Thus, the sensor panel 700 of the present disclosure may prevent an error in detecting the indicated position in the overlapping areas of the conductive lines and the bridge lines.

Figure 8:
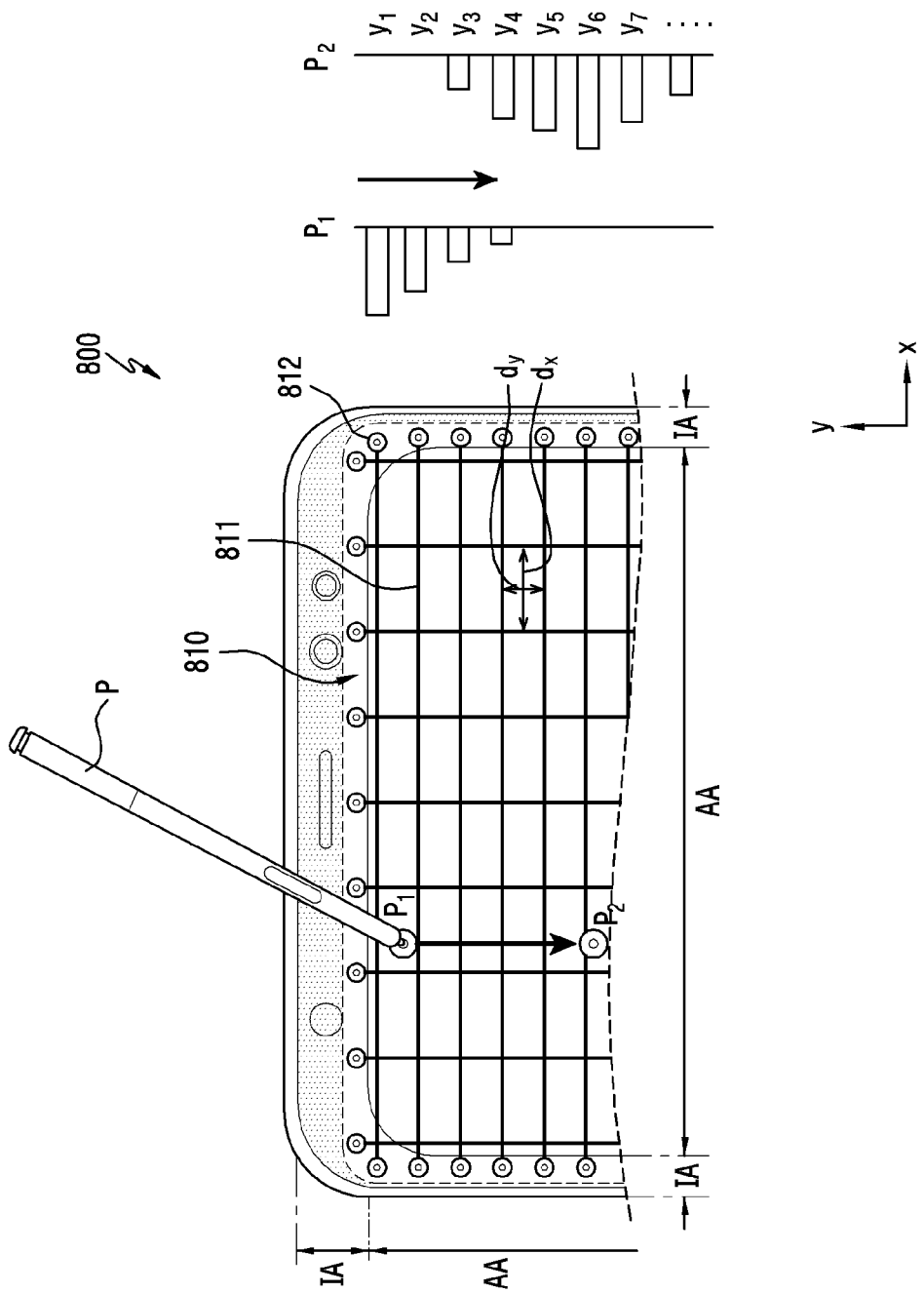
FIG. 8 is a plan view of a sensor panel mounted in an electronic device according to various embodiments of the present disclosure.

FIG. 8 is a plan view of a sensor panel mounted in an electronic device according to various embodiments of the present disclosure. A sensor panel 800 of FIG. 8 may be at least in part similar to or the same as the sensor panel 510 of FIG. 5 or the sensor panel 700 of FIG. 7.

Referring to FIG. 8, according to an embodiment, an AA of a display panel and an input sensor area of the sensor panel 810 may substantially correspond to each other. Conductive lines 811 of the sensor panel 810 may be, when viewed from above, disposed in the AA of an electronic device 800 (or the display panel). Via holes 812 of the sensor panel 810 may be, when viewed from above, disposed in an IA of the electronic device 800. Accordingly, the bridge lines connected to the via holes 812 are disposed substantially in the IA, and the conductive lines 811 of the AA may be disposed at substantially regular intervals (e.g., a horizontal direction $d_x$, a vertical direction $d_y$). Thus, the sensor panel 810 of the present disclosure may reduce an error in detecting an indicated position of a position indicator P and achieve more accurate position detection.

Figure 9:
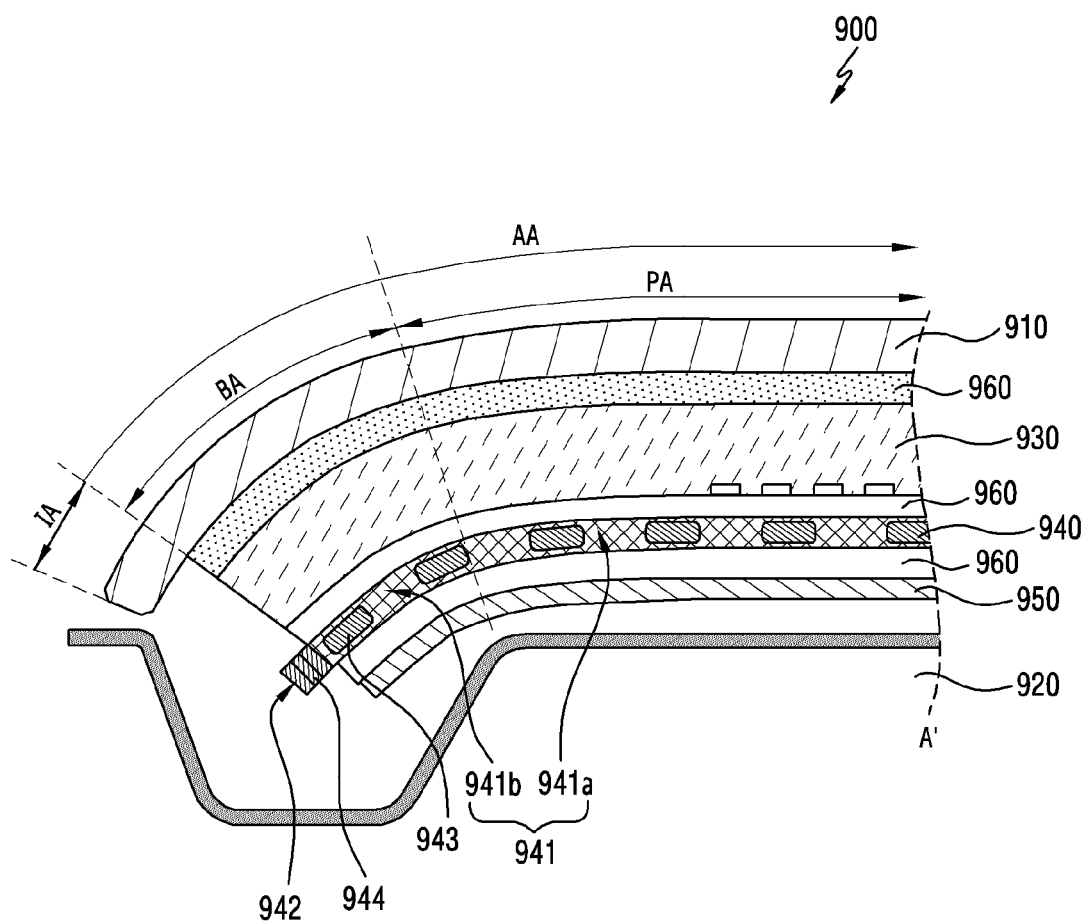
FIG. 9 is a cross-sectional view of a sensor panel mounted in an electronic device according to various embodiments of the present disclosure.

FIG. 9 is a cross-sectional view of a sensor panel mounted in an electronic device according to various embodiments of the present disclosure. Referring to FIG. 9, according to an embodiment, an electronic device 900 (e.g., the electronic device 200 of FIG. 2) may include a front plate 910 (e.g., the front plate 211 of FIG. 2), a bracket 920 (e.g., the back plate 212 of FIG. 2), a display panel 930 (e.g., the display panel 312 of FIG. 3) interposed between the front plate 910 and the bracket 920, a sensor panel 940 (e.g., the sensor panel 313 of FIG. 3), and a metal shield panel 950 (e.g., the shield panel 314 of FIG. 3). The display panel 930, the sensor panel 940, and the metal shield panel 950 may be sequentially laminated under the front plate 910. An adhesive layer 960 may be interposed between the layers. The front plate 910 may be divided into an AA corresponding to the display panel 920 and an IA outside the AA. An opaque printed layer (not shown) may be formed below the front plate 910 to correspond to the IA, wherein the inside of the electronic device 900 is not perceived in the IA.

According to an embodiment, the sensor panel 940 may be divided into a sensor area 941 and a non-sensor area 942 which correspond to the AA and the IA, respectively, of the front plate 910. Via holes 944 of the sensor panel 940 may be disposed in the non-sensor area 942 corresponding to the IA. In other words, the via holes 944 may be arranged in the non-sensor area 942, and all of conductive lines including an outermost conductive line 943 may be arranged in the sensor area 941 That is, the via holes 944 (or conductive vias) may be, when viewed from above the front plate 910, disposed outside an area (the AA) where the display panel 920 is exposed through the front plate 910. Alternatively, the via hole 944 may be, when viewed from above the front plate 910, disposed in an area corresponding to the IA in the sensor panel 940.

According to an embodiment, the front plate 910 of the electronic device 900 may be formed to include a bent area (BA) and a plane area (PA). Thus, the display panel 930, the sensor panel 940, and the metal shield panel 950 laminated under the front plate 910 may follow a shape of the front plate 910. The sensor area 941 of the sensor panel 940 may be divided into a plane portion 941a corresponding to the PA of the front plate 910 and a bending portion 941b corresponding to the BA. In the plane portion 941a and the bending portion 941b, the sensor panel 940 may include an arbitrary suitable configuration for the interval between conductive lines or dummy lines disposed between the conductive lines, by considering an opposing force of the bending and the indicated position compensation.

Figure 10:
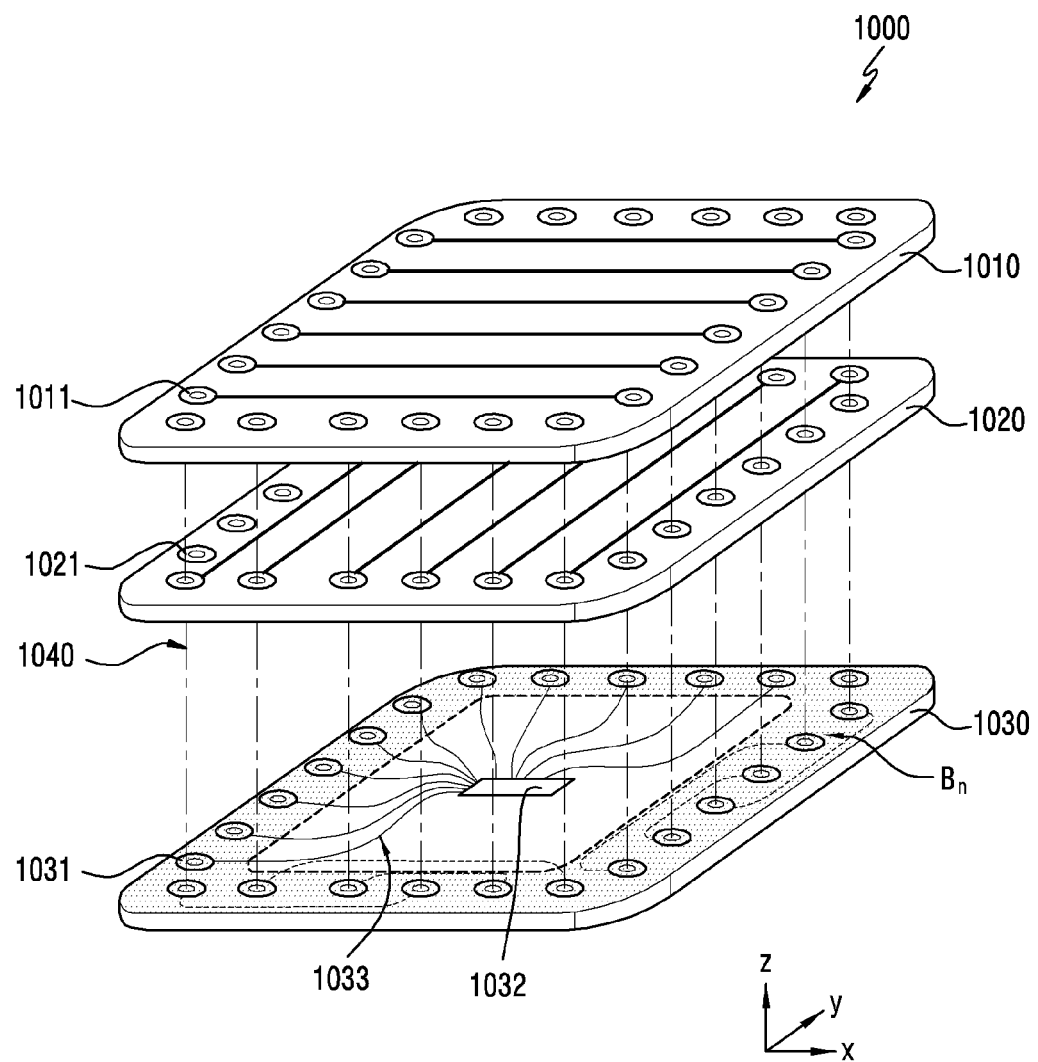
FIG. 10 is another perspective view of a lamination structure of a sensor panel according to various embodiments of the present disclosure.

FIG. 10 is another perspective view of a lamination structure of a sensor panel according to various embodiments of the present disclosure. A sensor panel 1000 of FIG. 10 may be configured at least in part similar to or the same as the sensor panel 510 of FIG. 5 or the sensor panel 700 of FIG. 7.

According to an embodiment, a third layer 1030 may include bridge lines $B_n$ which form a loop coil with conductive lines $X_n$ and $Y_n$ of a first layer 1010 and a second layer 1020. Further, the third layer 1030 may include connecting lines 1033 which electrically connect second via holes 1031 and a connector 1032. The connector 1032 may be electrically connected with other end of the conductive lines $X_n$ and $Y_n$, which are connected to the bridge lines $B_n$ with one end, through conductive vias 1040. For example, second via holes 1031 may be electrically connected with other via holes 1011 and 1021 through the first layer 1010 and/or the second layer 1020. The connecting lines 1033 electrically connected with the second via holes 1031 may be electrically connected to the connector 1032 of the third layer 1030. The connector 1032 may be electrically connected to a printed circuit board (e.g., the printed circuit board 340 of FIG. 3) which is disposed below the sensor panel 1000. According to an embodiment, the connector 1032 may include a conductive contact, and be electrically connected with a processor for controlling the connector 1032 and the sensor panel 1000 of the printed circuit board by including a conductive structure (not shown) between the sensor panel 1000 and the printed circuit board. For example, the connector 1032 may be connected to a channel selector (e.g., the channel selector 411 of FIG. 4) or a switching circuit (e.g., the switching circuit 440 of FIG. 4). In this case, the conductive structure may include a C-clip, a pogo-pin, a bonding pad, and so on. According to an embodiment, the connector 1032 may be electrically connected with a flexible printed circuit board connected below the third layer 1030, and a processor for controlling the sensor panel 1000 on the printed circuit board through a coaxial cable. In an embodiment, the third layer 1030 may further include a multiplex (MUX). The MUX, between the connecting lines 1033 and the connector 1032, may combine signals of the connecting lines 1033 and provide the combined signal to the connector 1032.

Figure 11A:
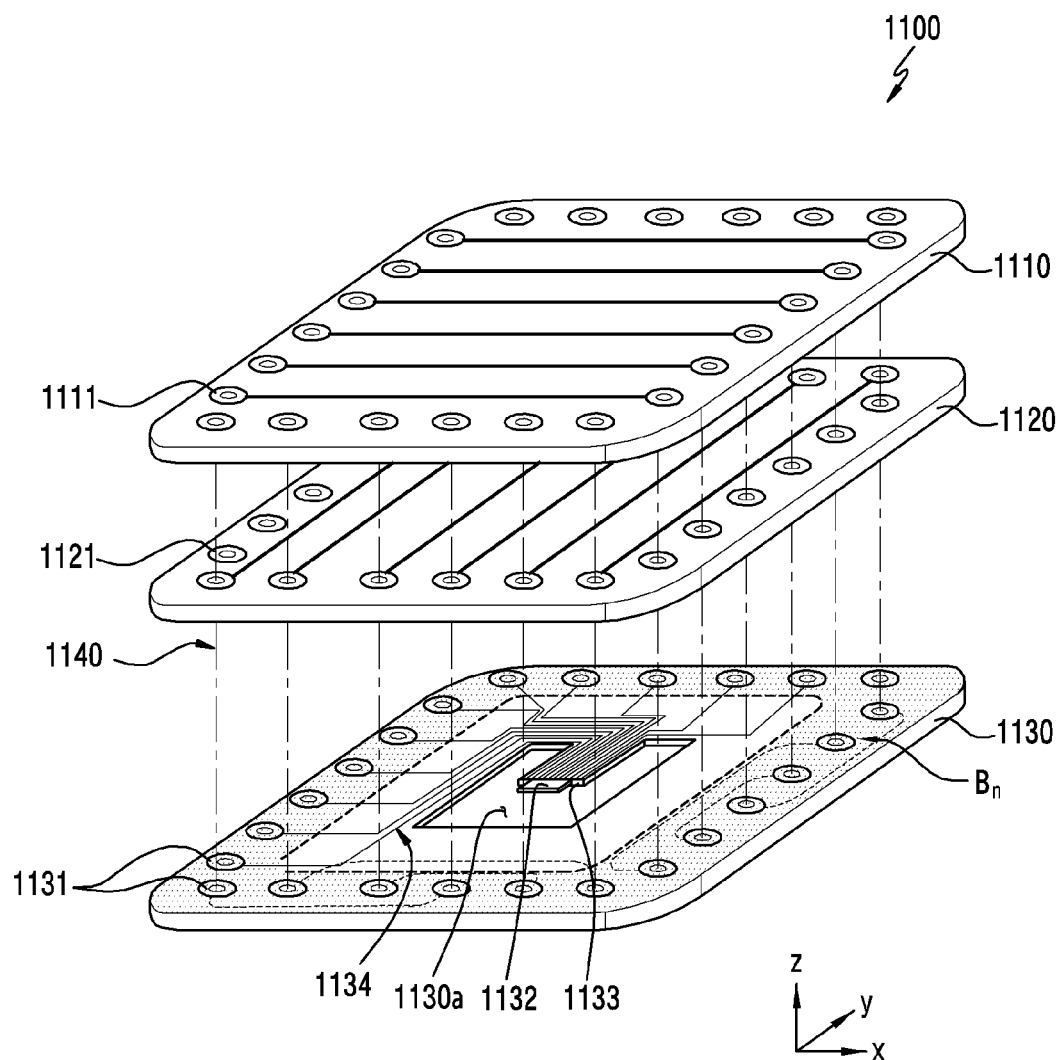
FIG. 11A is yet another perspective view of a lamination structure of a sensor panel according to various embodiments of the present disclosure.
Figure 11B:
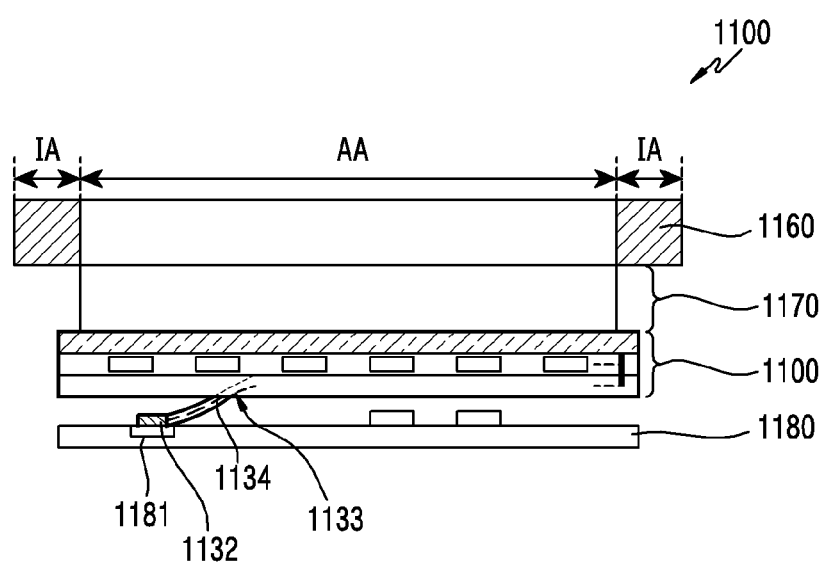
FIG. 11B is a cross-sectional view of a sensor panel according to various embodiments of the present disclosure.

FIG. 11A is yet another perspective view of a lamination structure of a sensor panel according to various embodiments of the present disclosure. FIG. 11B is a cross-sectional view of the sensor panel of FIG. 11A. The sensor panel 1100 of FIG. 11A and FIG. 11B may be at least in part similar to or the same as the sensor panel 510 of FIG. 5 or the sensor panel 700 of FIG. 7.

According to an embodiment, a third layer 1130 may include bridge lines $B_n$ which form a loop coil with conductive lines $X_n$ and $Y_n$ of a first layer 1110 and a second layer 1120. Further, the third layer 1130 may include second via holes 1131, a connecting portion 1133 including a connector 1132, and connecting lines 1134 which electrically connect the second via holes 1131 and the connector 1132. The connector 1132 may be electrically connected with other end of the conductive lines $X_n$ and $Y_n$, which form the loop coil and are connected to the bridge lines $B_n$ with one end, through conductive vias 1140. For example, second via holes 1131 may be electrically connected with other via holes 1111 and 1121 through the first layer 1110 and/or the second layer 1120. The connecting lines 1134 electrically connected with the second via holes 1131 may be electrically connected to the connector 1132 of the third layer 1130. The connecting portion 1133 may extend and protrude in an opening 1130a of the third layer 1130. The opening 1130a and the connecting portion 1133 may be formed when the third layer 1130 is manufactured, raw material is cut, or an external form is manufactured. The sensor panel 1100 may be fabricated through a multi-layer process which first manufactures the external forms of the first layer 1110, the second layer 1120, and the third layer 1130 including the connecting portion 1133, and then laminates the layers. The third layer 1130 may be formed with a flexible printed circuit board. Hence, the connecting portion 1133, which is easily bent, may be connected with other electronic parts spaced from the sensor panel 1130. The sensor panel 1110 may be connected to a processor which controls the sensor panel 1100 through the flexible connecting portion 1133. Referring to FIG. 11B, the sensor panel 1100 may be laminated below the front plate 1160. Various panels or layers, for example, a display panel 1170 may be interposed between the front plate 1160 and the sensor panel 1100. The sensor panel 1100 may be disposed to include a sensor area in an area corresponding to an AA of the front plate 1160 and to include a non-sensor area including via holes and bridge lines in an IA.

According to an embodiment, a printed circuit board 1180 may be spaced below the sensor panel 1100. The connector 1132 formed at an end of the connecting portion 1133 may be electrically connected to the connecting lines 1134 which are connected to the conductive lines of the sensor panel 1100. As the connecting portion 1133 is bent, the connector 1132 may be connected to a connector 1181 on the printed circuit board 1180. Hence, the connecting portion 1133 formed as part of the third layer 1130 of the sensor panel 1100 according to an embodiment of the present disclosure may serve as an interface which electrically connects the sensor panel 1100 with other electronic parts. By means of such an interface, it is possible to save a space on the IA where electronic parts, such as FPCB, for electrically connecting the sensor panel 1100 with other electronic parts are mounted.

According to various embodiments of the present disclosure, an electronic device may include a housing including a front plate (e.g., 310 of FIG. 3) and a back plate (e.g., 330 of FIG. 3) which faces away from the front plate, a display panel (e.g., 312 of FIG. 3) interposed between the front plate and the back plate and exposed through the front plate, an EMR sensor panel (e.g., 330 of FIG. 3) interposed between the display panel and the back plate, and a sensor circuit (e.g., 430 of FIG. 3) configured to detect a stylus pen, using the EMR sensor panel, wherein the EMR sensor panel includes a first layer (e.g., 610 of FIG. 6A), a second layer (e.g., 612 of FIG. 6A), and a third layer (e.g., 630 of FIG. 6A) which are substantially parallel to the display panel, the first layer includes a first plurality of conductive lines (e.g., $X_n$ of FIG. 6A) which extend parallel to one another in a first direction (e.g., x axis direction of FIG. 6A), when viewed from above the front plate, the second layer includes a second plurality of conductive lines (e.g., $Y_n$ of FIG. 6) which extend parallel to one another in a second direction (e.g., y direction of FIG. 6A) substantially perpendicular to the first direction, when viewed from above the front plate, and the third layer includes a third plurality of conductive lines (e.g., $B_n$ of FIG. 6A), each of the third plurality of conductive lines electrically connected to ends of respective two of the first plurality of the conductive lines or the second plurality of the conductive lines, through conductive vias (e.g., 640 of FIG. 6A) formed through at least one of the first layer, the second layer, or the third layer.

According to various embodiments of the present disclosure, the first layer may include a fourth plurality of conductive lines (e.g., $B_2$ of FIG. 7), and each of the fourth plurality of the conductive lines may be electrically connected to ends of respective two of the second plurality of the conductive lines, through the conductive vias formed through the first layer and/or the second layer.

According to various embodiments of the present disclosure, the second layer may include a fifth plurality of conductive lines (e.g., $B_1$ of FIG. 7), and each of the fifth plurality of the conductive lines may be electrically connected to ends of respective two of the first plurality of the conductive lines, through the conductive vias formed through the first layer and/or second layer.

According to various embodiments of the present disclosure, the second layer may be interposed between the first layer and the third layer.

According to various embodiments of the present disclosure, the third layer may be interposed between the first layer and the second layer.

According to various embodiments of the present disclosure, each of the third plurality of the conductive lines may include a portion which is substantially perpendicular to the respective two of the first plurality of the conductive lines or the second plurality of the conductive lines, when viewed from above the front plate.

According to various embodiments of the present disclosure, the third plurality of the conductive lines may be positioned in peripheral portions of the third layer.

According to various embodiments of the present disclosure, the EMR sensor panel may include a bending portion including at least part of the peripheral portions.

According to various embodiments of the present disclosure, the third plurality of the conductive lines may form a loop coil by electrically connecting two of the first plurality of the conductive lines and/or the second plurality of the conductive lines.

According to various embodiments of the present disclosure, the conductive vias may be positioned outside an area (e.g., the AA of FIG. 8) where the display panel is exposed through the front plate, when viewed from above the front plate.

According to various embodiments of the present disclosure, the fourth plurality of the conductive lines may include a portion which is substantially parallel to the first conductive lines.

According to various embodiments of the present disclosure, the fifth plurality of the conductive lines may include a portion which is substantially parallel to the second conductive lines.

According to various embodiments of the present disclosure, at least part of the third plurality of the conductive lines may be disposed outside outermost conductive lines (e.g., $X'_1$ of FIG. 7) of the first plurality of the conductive lines and outermost conductive lines (e.g., $Y'_1$ of FIG. 7) of the second plurality of the conductive lines, when viewed from above the front plate.

According to various embodiments of the present disclosure, the EMR sensor panel may be formed as a multi-layer printed circuit board.

According to various embodiments of the present disclosure, the first plurality of the conductive lines and the second plurality of the conductive lines may include conductive patterns formed on the printed circuit board respectively.

According to various embodiments of the present disclosure, an electronic device may include a housing including a front plate and a back plate which faces away from the front plate; a display panel interposed between the front plate and the back plate and exposed through an active area of the front plate; an EMR sensor panel interposed between the display panel and the back plate; and a sensor circuit configured to detect a stylus pen, using the EMR sensor panel, wherein the EMR sensor panel includes a first layer, a second layer, and a third layer which are substantially parallel to the display panel, wherein the first layer includes a first plurality of conductive lines which extend parallel to one another in a first direction, when viewed from above the front plate, the second layer includes a second plurality of conductive lines which extend parallel to one another in a second direction substantially perpendicular to the first direction, when viewed from above the front plate, the third layer includes 4a third plurality of conductive lines, each of the third plurality of conductive lines electrically connected to ends of respective two of the first plurality of the conductive lines or the second plurality of the conductive lines, through conductive vias formed through at least one of the first layer, the second layer, or the third layer, and the conductive vias are disposed outside the active area, when viewed from above the front plate.

According to various embodiments of the present disclosure, at least part of the third plurality of the conductive lines may be disposed outside the active area, when viewed from above the front plate.

According to various embodiments of the present disclosure, at least part of the third plurality of the conductive lines may not cross the first plurality of the conductive lines and the second plurality of the conductive lines in the active area, when viewed from above the front plate.

According to various embodiments of the present disclosure, the third plurality of the conductive lines may form a loop coil by electrically connecting two of the first plurality of the conductive lines and/or the second plurality of the conductive lines.

According to various embodiments of the present disclosure, the EMR sensor panel may be formed on a multi-layer printed circuit board, and the first plurality of the conductive lines and the second plurality of the conductive lines may include conductive patterns formed on the multi-layer printed circuit board respectively.

According to various embodiments of the present disclosure, an electronic device may include a housing including a front plate and a back plate which faces away from the front plate; a display panel interposed between the front plate and the back plate and exposed through an active area of the front plate; an EMR sensor panel interposed between the display panel and the back plate; and a sensor circuit configured to detect a stylus pen, using the EMR sensor panel, wherein the EMR sensor panel includes a first layer, a second layer, and a third layer which are substantially parallel to the display panel, wherein the first layer includes a first plurality of conductive lines which extend parallel to one another in a first direction, when viewed from above the front plate, the second layer includes a second plurality of conductive lines which extend parallel to one another in a second direction substantially perpendicular to the first direction, when viewed from above the front plate, the third layer includes a third plurality of conductive lines and a fourth plurality of conductive lines, each of the third plurality of the conductive lines is electrically connected to first ends of respective two of the first plurality of the conductive lines or the second plurality of the conductive lines, through first conductive vias formed through at least one of the first layer, the second layer, or the third layer, and each of the fourth plurality of the conductive lines is electrically connected to second ends of respective two of the first plurality of the conductive lines and the second plurality of the conductive lines, through second conductive vias formed through at least one of the first layer, the second layer, or the third layer, and is integrated to a connector of the third layer.

According to various embodiments of the present disclosure, the connector may be electrically connected to the sensor circuit through a flexible printed circuit board.

According to various embodiments of the present disclosure, the first conductive vias and the second conductive vias may be disposed outside the active area, when viewed from above the front plate.

While the present disclosure has been shown and described with reference to various embodiments thereof, it will be understood by those skilled in the art that various changes in form and details may be made therein without departing from the spirit and scope of the present disclosure as defined by the appended claims and their equivalents.

What is claimed is:

1. An electronic device comprising:
a housing comprising a front plate and a back plate which faces away from the front plate;
a display panel interposed between the front plate and the back plate and exposed through the front plate;
an electromagnetic radiation (EMR) sensor panel interposed between the display panel and the back plate; and
a sensor circuit configured to detect a stylus pen, using the EMR sensor panel,
wherein the EMR sensor panel comprises a first layer, a second layer, and a third layer which are substantially parallel to the display panel,
wherein the first layer comprises a first plurality of conductive lines which extend parallel to one another in a first direction, when viewed from above the front plate,
the second layer comprises a second plurality of conductive lines which extend parallel to one another in a second direction substantially perpendicular to the first direction, when viewed from above the front plate, and
the third layer comprises a third plurality of conductive lines, each of the third plurality of conductive lines electrically connected to ends of a respective two of the first plurality of the conductive lines or the second plurality of the conductive lines, through conductive vias formed through at least one of the first layer, the second layer, or the third layer,
wherein the third plurality of the conductive lines forms a loop coil by electrically connecting two of the first plurality of the conductive lines and/or the second plurality of the conductive lines.

2. The electronic device of claim 1, wherein the first layer comprises a fourth plurality of conductive lines, and each of the fourth plurality of the conductive lines is electrically connected to ends of respective two of the second plurality of the conductive lines, through the conductive vias formed through the first layer and/or the second layer.

3. The electronic device of claim 2, wherein the second layer comprises a fifth plurality of conductive lines, and each of the fifth plurality of the conductive lines is electrically connected to ends of respective two of the first plurality of the conductive lines, through the conductive vias formed through the first layer and/or the second layer.

4. The electronic device of claim 2, wherein the fourth plurality of the conductive lines comprises a portion which is substantially parallel to the first conductive lines.

5. The electronic device of claim 3, wherein the fifth plurality of the conductive lines comprises a portion which is substantially parallel to the second conductive lines.

6. The electronic device of claim 1, wherein the second layer is interposed between the first layer and the third layer.

7. The electronic device of claim 1, wherein the third layer is interposed between the first layer and the second layer.

8. The electronic device of claim 1, wherein each of the third plurality of the conductive lines comprises a portion which is substantially perpendicular to the respective two of the first plurality of the conductive lines or the second plurality of the conductive lines, when viewed from above the front plate.

9. The electronic device of claim 1, wherein the third plurality of the conductive lines is positioned in peripheral portions of the third layer.

10. The electronic device of claim 9, wherein the EMR sensor panel comprises a bending portion comprising at least part of the peripheral portions.

11. The electronic device of claim 1, wherein at least part of the third plurality of the conductive lines is disposed outside outermost conductive lines of the first plurality of the conductive lines and outermost conductive lines of the second plurality of the conductive lines, when viewed from above the front plate.

12. The electronic device of claim 1, wherein the conductive vias are positioned outside an area where the display panel is exposed through the front plate, when viewed from above the front plate.

13. An electronic device comprising:
a housing comprising a front plate and a back plate which faces away from the front plate;
a display panel interposed between the front plate and the back plate and exposed through an active area of the front plate;
an electromagnetic radiation (EMR) sensor panel interposed between the display panel and the back plate; and
a sensor circuit configured to detect a stylus pen, using the EMR sensor panel,
wherein the EMR sensor panel comprises a first layer, a second layer, and a third layer which are substantially parallel to the display panel,
wherein the first layer comprises a first plurality of conductive lines which extend parallel to one another in a first direction, when viewed from above the front plate,
the second layer comprises a second plurality of conductive lines which extend parallel to one another in a second direction substantially perpendicular to the first direction, when viewed from above the front plate,
the third layer comprises a third plurality of conductive lines, each of the third plurality of conductive lines electrically connected to ends of a respective two of the first plurality of the conductive lines or the second plurality of the conductive lines, through conductive vias formed through at least one of the first layer, the second layer, or the third layer, and
the conductive vias are disposed outside the active area, when viewed from above the front plate,
wherein the third plurality of the conductive lines forms a loop coil by electrically connecting two of the first plurality of the conductive lines and/or the second plurality of the conductive lines.

14. The electronic device of claim 13, wherein at least part of the third plurality of the conductive lines is disposed outside the active area, when viewed from above the front plate.

15. The electronic device of claim 13, wherein at least part of the third plurality of the conductive lines do not cross the first plurality of the conductive lines and the second plurality of the conductive lines in the active area, when viewed from above the front plate.

16. The electronic device of claim 13, wherein the third plurality of the conductive lines connecting two of the first plurality of the conductive lines and/or the second plurality of the conductive lines.

17. An electronic device comprising:
a housing comprising a front plate and a back plate which faces away from the front plate;
a display panel interposed between the front plate and the back plate and exposed through an active area of the front plate;
an electromagnetic radiation (EMR) sensor panel interposed between the display panel and the back plate; and
a sensor circuit configured to detect a stylus pen, using the EMR sensor panel,
wherein the EMR sensor panel comprises a first layer, a second layer, and a third layer which are substantially parallel to the display panel,
wherein the first layer comprises a first plurality of conductive lines which extend parallel to one another in a first direction, when viewed from above the front plate,
the second layer comprises a second plurality of conductive lines which extend parallel to one another in a second direction substantially perpendicular to the first direction, when viewed from above the front plate,
the third layer comprises a third plurality of conductive lines and a fourth plurality of conductive lines,
each of the third plurality of the conductive lines is electrically connected to first ends of respective two of the first plurality of the conductive lines or the second plurality of the conductive lines, through first conductive vias formed through at least one of the first layer, the second layer, or the third layer, and
each of the fourth plurality of the conductive lines is electrically connected to second ends of respective two of the first plurality of the conductive lines and the second plurality of the conductive lines, through second conductive vias formed through at least one of the first layer, the second layer, or the third layer, and is integrated to a connector of the third layer.

18. The electronic device of claim 17, wherein the connector is electrically connected to the sensor circuit through a flexible printed circuit board.

19. The electronic device of claim 17, wherein the first conductive vias and the second conductive vias are disposed outside the active area, when viewed from above the front plate.

* * * * *